US010989664B2

(12) United States Patent
Adell et al.

(10) Patent No.: US 10,989,664 B2
(45) Date of Patent: Apr. 27, 2021

(54) OPTICAL SYSTEMS AND METHODS OF CHARACTERIZING HIGH-K DIELECTRICS

(71) Applicant: California Institute of Technology, Pasadena, CA (US)

(72) Inventors: Philippe C. Adell, Pasadena, CA (US); Harry A. Atwater, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 127 days.

(21) Appl. No.: 15/256,442

(22) Filed: Sep. 2, 2016

(65) Prior Publication Data
US 2017/0067830 A1  Mar. 9, 2017

Related U.S. Application Data

(60) Provisional application No. 62/213,753, filed on Sep. 3, 2015, provisional application No. 62/237,146, filed on Oct. 5, 2015.

(51) Int. Cl.
G01N 21/63 (2006.01)
G01N 21/64 (2006.01)
(Continued)

(52) U.S. Cl.
CPC ....... *G01N 21/6489* (2013.01); *G01N 21/636* (2013.01); *G01N 21/8851* (2013.01);
(Continued)

(58) Field of Classification Search
CPC ........... G01N 21/9505; G01N 21/8851; G01N 21/6489
See application file for complete search history.

(56) References Cited

U.S. PATENT DOCUMENTS 3,850,508 A   11/1974   Sittig et al.
4,286,215 A   8/1981   Miller
(Continued)

FOREIGN PATENT DOCUMENTS

EP   0 378 061       7/1990
EP   0 710 848 A1   5/1996
(Continued)

OTHER PUBLICATIONS

Shaver et al., A 2D Finite Difference Simulation to Investigate the High Voltage Blocking Characteristics of 4H-SiC Photoconductive semiconductor Switches,978-1-4799-8403-9/15 © 2015 IEEE.*
(Continued)

*Primary Examiner* — David P Porta
*Assistant Examiner* — Djura Malevic
(74) *Attorney, Agent, or Firm* — Knobbe, Martens, Olson & Bear, LLP

(57) ABSTRACT

The disclosed technology generally relates to characterization of semiconductor structures, and more particularly to optical characterization of high-k dielectric materials. A method includes providing a semiconductor structure comprising a semiconductor and a high-k dielectric layer formed over the semiconductor, wherein the dielectric layer has electron traps formed therein. The method additionally includes at least partially transmitting an incident light having an incident energy through the high-k dielectric layer and at least partially absorbing the incident light in the semiconductor. The method additionally includes measuring a nonlinear optical spectrum resulting from the light having the energy different from the incident energy, the nonlinear optical spectrum having a first region and a second region, wherein the first region changes at a different rate in intensity compared to the second region. The method further includes determining from the nonlinear optical spectrum
(Continued)

one or both of a first time constant from the first region and a second time constant from the second region, and determining a trap density in the high-k dielectric layer based on the one or both of the first time constant and the second time constant.

25 Claims, 8 Drawing Sheets

(51) Int. Cl.
    *G01N 21/88*     (2006.01)
    *G01N 21/95*     (2006.01)
    *G01R 29/24*     (2006.01)
    *G01R 31/302*     (2006.01)
    *H01L 21/66*     (2006.01)
    *H01L 29/423*     (2006.01)
    *H01L 29/51*     (2006.01)

(52) U.S. Cl.
    CPC ......... *G01N 21/9505* (2013.01); *G01R 29/24* (2013.01); *G01R 31/302* (2013.01); *H01L 22/12* (2013.01); *G01N 21/9501* (2013.01); *H01L 29/42364* (2013.01); *H01L 29/513* (2013.01); *H01L 29/517* (2013.01)

(56) References Cited

U.S. PATENT DOCUMENTS

| | | | |
|---|---|---|---|
| 4,291,961 A | 9/1981 | Takayama | |
| 5,294,289 A | 3/1994 | Heinz et al. | |
| 5,557,409 A | 9/1996 | Downer et al. | |
| 5,814,820 A | 9/1998 | Dong et al. | |
| 6,147,799 A | 11/2000 | MacDonald | |
| 6,321,601 B1 | 11/2001 | Maris | |
| 6,356,377 B1 | 3/2002 | Bishop et al. | |
| 6,650,800 B2 | 11/2003 | Litvin | |
| 6,795,175 B2 | 2/2004 | Hunt | |
| 6,751,374 B2 | 6/2004 | Wu et al. | |
| 6,781,686 B2 | 8/2004 | Hunt | |
| 6,788,405 B2 | 9/2004 | Hunt | |
| 6,791,099 B2 | 9/2004 | Some et al. | |
| 6,819,844 B2 | 11/2004 | Hunt | |
| 6,856,159 B1 | 2/2005 | Tolk et al. | |
| 6,882,414 B2 | 4/2005 | Hunt | |
| 6,898,359 B2 | 5/2005 | Soljacic et al. | |
| 6,900,894 B2 | 5/2005 | McMillen et al. | |
| 7,158,284 B2 | 1/2007 | Alles et al. | |
| 7,259,868 B2 | 8/2007 | Ozcan et al. | |
| 7,304,305 B2 | 12/2007 | Hunt | |
| 7,324,267 B2 | 1/2008 | Melloni et al. | |
| 7,333,192 B2 | 2/2008 | Nakano et al. | |
| 7,355,618 B2 | 4/2008 | Seto et al. | |
| 7,362,496 B2 | 4/2008 | Boretz et al. | |
| 7,433,056 B1 | 10/2008 | Janik | |
| 7,580,138 B2 | 8/2009 | Price | |
| 7,592,828 B2* | 9/2009 | Song .................. | G01R 31/2648 324/762.01 |
| 7,595,204 B2 | 9/2009 | Price | |
| 7,616,307 B2 | 11/2009 | Murtagh et al. | |
| 7,659,979 B2 | 2/2010 | Murtagh et al. | |
| 7,684,047 B2 | 3/2010 | Drake et al. | |
| 7,718,969 B2 | 5/2010 | Zhang et al. | |
| 7,781,739 B1* | 8/2010 | Jannson .................. | G01T 1/29 250/336.1 |
| 7,830,527 B2 | 11/2010 | Chen | |
| 7,893,703 B2 | 2/2011 | Rzepiela et al. | |
| 7,894,126 B2 | 2/2011 | Gunter et al. | |
| 7,982,944 B2 | 7/2011 | Kippenberg et al. | |
| 8,049,304 B2* | 11/2011 | Srividya .................. | C23C 16/40 257/532 |
| 8,143,660 B2* | 3/2012 | Lee .................. | C23C 16/40 257/296 |
| 8,525,287 B2 | 9/2013 | Tian et al. | |
| 8,573,785 B2 | 11/2013 | Kuksenkov et al. | |
| 8,693,301 B2 | 4/2014 | Knittel et al. | |
| 8,755,044 B2 | 6/2014 | Reich et al. | |
| 9,018,968 B2* | 4/2015 | Huang .................. | H01L 22/34 324/762.01 |
| 9,194,908 B2 | 11/2015 | Heidmann | |
| 9,285,338 B2* | 3/2016 | Dickerson ............ | G01N 27/447 |
| 9,652,729 B2 | 5/2017 | Hoffman, Jr. et al. | |
| 9,759,656 B2 | 9/2017 | Ito et al. | |
| 10,274,310 B2 | 4/2019 | Hunt et al. | |
| 10,371,668 B2 | 8/2019 | Garnett et al. | |
| 10,551,325 B2 | 2/2020 | Koldiaev et al. | |
| 10,591,525 B2 | 3/2020 | Koldiaev et al. | |
| 10,613,131 B2 | 4/2020 | Koldiaev et al. | |
| 10,663,504 B2 | 5/2020 | Koldiaev et al. | |
| 2002/0080356 A1* | 6/2002 | McMillen .......... | G01N 21/4738 356/445 |
| 2003/0148391 A1 | 8/2003 | Salafsky | |
| 2004/0238872 A1* | 12/2004 | Lee .................. | C23C 16/40 257/306 |
| 2005/0058165 A1 | 3/2005 | Morehead et al. | |
| 2007/0152673 A1* | 7/2007 | Song .................. | G01R 31/2648 324/500 |
| 2007/0213954 A1 | 9/2007 | Price | |
| 2009/0195967 A1* | 8/2009 | Srividya .................. | C23C 16/40 361/524 |
| 2010/0208757 A1 | 8/2010 | Hu | |
| 2010/0272134 A1 | 10/2010 | Blanding et al. | |
| 2011/0125458 A1 | 5/2011 | Xu et al. | |
| 2011/0309236 A1* | 12/2011 | Tian .................. | H01L 27/14603 250/208.1 |
| 2012/0019816 A1 | 1/2012 | Shibata | |
| 2013/0003070 A1 | 1/2013 | Sezaki et al. | |
| 2013/0118904 A1* | 5/2013 | Dickerson ............ | G01N 27/447 204/547 |
| 2013/0214810 A1* | 8/2013 | Huang .................. | H01L 22/34 324/762.01 |
| 2015/0330908 A1 | 11/2015 | Koldiaev | |
| 2015/0330909 A1* | 11/2015 | Koldiaev .................. | G01N 21/8806 356/237.2 |
| 2015/0331029 A1 | 11/2015 | Koldiaev | |
| 2015/0331036 A1 | 11/2015 | Koldiaev | |
| 2016/0131594 A1 | 5/2016 | Koldiaev | |
| 2018/0292441 A1 | 10/2018 | Koldiaev et al. | |
| 2020/0057104 A1 | 2/2020 | Ma et al. | |
| 2020/0088784 A1 | 3/2020 | Lei | |
| 2020/0110029 A1 | 4/2020 | Lei | |

FOREIGN PATENT DOCUMENTS

| | | |
|---|---|---|
| JP | 2004-226224 | 8/2004 |
| JP | 2008-218957 | 9/2008 |
| TW | 200421460 A | 10/2004 |
| WO | WO 00/55885 | 9/2000 |
| WO | WO 02/065108 | 8/2002 |
| WO | WO 2015/161136 | 10/2015 |
| WO | WO 2016/077617 | 5/2016 |
| WO | WO 2017/041049 | 3/2017 |
| WO | WO 2019/210229 | 10/2019 |
| WO | WO 2019/210265 | 10/2019 |
| WO | WO 2019/222260 | 11/2019 |

OTHER PUBLICATIONS

Jiang et al. , Finite difference method for analyzing band structure in semiconductor heterostructures without spurious solution, Journal of Applied Physics 116, 173702 (2014).*
Nagel et al. Solving the Generalized Poisson Equation Using the Finite-Difference Method (FDM), Feb. 15, 2012.*
Jozwikowska, Numerical solution of the nonlinear Poisson equation for semiconductor devices by application of a diffusion-equation finite difference scheme, Journal of Applied Physics 104, 063715 (2008).*
Vasidevam et al., A numerical simulation of hole and electron trapping due to radiation in silicon dioxide,J. Appl. 70, 4490 (1991).*

(56) References Cited

OTHER PUBLICATIONS

Adell, P.C., et. al. "Impact of Hydrogen Contamination on the Total Dose Response of Linear Bipolar Microcircuits". 2007, IEEE, 8 pgs.
Dixit, Sriram K., et al. "Radiation Induced Charge Trapping in Ultrathin $HfO_2$-Based MOSFETs." IEEE Transactions on Nuclear Science, Dec. 2007, vol. 54, No. 6, p. 1883-1890.
Esqueda, Ivan S., et al. "Modeling the Effects of Hydrogen on the Mechanisms of Dose Rate Sensitivity." RADECS 2011 Proceedings A1, 2011, IEEE, pp. 1-6.
Kang, A.Y., et al. "The Radiation Response of the High Dielectric-Constant Hafnium Oxide/Silicon System." IEEE Transactions on Nuclear Science, Dec. 2002, vol. 49, No. 6, pp. 2636-2642.
Koldyaev, V., et al. "Rapid Non-Destructive Detection of Sub-Surface Cu in Silicon-On-Insulator Wafers by Optical Second Harmonic Generation." 2015 $26^{th}$ Annual Semi Advanced Semiconductor Manufacturing Conference (ASMC). IEEE, 2015; 4 pages.
Park, Hyunwoo, et al. "Total Ionizing Dose Effects on Strained $HfO_2$-Based nMOSFETs." IEEE Transactions on Nuclear Science, Dec. 2008, vol. 55, No. 6 pp. 2981-2985.
"Rapid Non-destructive Characterization of Trap Densities and Layer Thicknesses in $HfO_2$ Gate Materials Using Optical Second Harmonic Generation." Semicon Korea, Santa Ana, California, Jan. 2016; 24 pages.
International Search Report and Written Opinion of the International Searching Authority dated Dec. 21, 2016 in PCT Application No. US2016/050286.
Fomenko et al., "Second harmonic generation investigations of charge transfer at chemically-modified semiconductor interfaces", *Journal of Applied Physics*, vol. 91, No. 7, Apr. 2002, pp. 4394-4398.
Marka et al., "Band offsets measurement of Si—$SiO_2$ interfaces by internal photoemission induced second-harmonic generation", *Physical Review Journal*, 2003, 2 pages.
Office Action dated Sep. 28, 2017 in corresponding Taiwan Patent Application No. 105131588.
International Preliminary Report on Patentability and Written Opinion for PCT Application No. PCT/US2016/050286, dated Mar. 6, 2018 in 13 pages.
Extended European Search Report for application No. 16843152.6, dated Feb. 26, 2019, in 11 pages.
Fomenko et al., "Optical second harmonic generation studies of ultrathin high-k dielectric stacks", Journal of Applied Physics, American Institute of Physics, vol. 97(8), Apr. 11, 2005.
Gielis et al., "Negative charge and charging dynamics in $Al_2 O_3$ films on Si characterized by second-harmonic generation", Journal of Applied Physics, American Institute of Physics, vol. 104(7):7370173701,2008.
Mihaychuk et al, "Time-dependent second-harmonic generation from the Si-$SiO_2$ interface induced by charge transfer", Optics Letters, vol. 20(20):2063-2065 (Oct. 1995).
Price et al., "Charge trapping defects in Si/$SiO_2$/$Hf_{(i-x)}$ $Si_x$ $O_2$ film stacks characterized by spectroscopic second-harmonic generation", Journal of Vacuum Science and Technology: Part B, AVS/SIP, Melville, New York, NY vol. 29(4):4D101-4D101 (2011).
Alles, M. et al, "Second Harmonic Generation for Noninvasive Metrology of Silicon-on-Insulators Wafers", IEEE Transactions on Semiconductor Manufacturing, vol. 20(2), May 2007, pp. 107-113, in 7 pages.
An, Y. et al., "Role of photo-assisted tunneling in time-dependent second-harmonic generation from Si surfaces with ultrathin oxides", Applied Physics Letters, vol. 102, Feb. 4, 2013, pp. 051602-0516024, in 5 pages.
Bierwagen, O. et al., "Dissipation-factor-based criterion for the validity of carrier-type identification by capacitance-voltage measurements", Applied Physics Letters, vol. 94, Apr. 2009, pp. 152110-1521103, in 3 pages.

Bloch, J. et al., "Electron Photoinjection from Silicon to Ultrathin $SiO_2$ Films via Ambient Oxygen", Physical Review Letters vol. 77(5), Jul. 29, 1996, pp. 920-923, in 4 pages.
Campagnola, P., "Second Harmonic Generation Imaging Microscopy: Applications to Diseases Diagnostics", Analytical Chemistry, May 2011, pp. 3224-3231, in 16 pages.
Chang, C. L. et al., "Direct determination of flat-band voltage for metal/high K oxide/semiconductor heterointerfaces by electric-field-induced second-harmonic generation", Applied Physics Letters vol. 98, Apr. 2011, pp. 171902-171902-3, in 3 pages.
Dautrich, M. et al., "Noninvasive nature of corona charging on thermal Si/$SiO_2$ structures", Applied Physics Letters, vol. 85(10), Sep. 6, 2004, pp. 1844-1845, in 2 pages.
De Vries, J. et al., "Measuring the concentration and energy distribution of interface states using a non-contact corona oxide semiconductor method", Applied Physics Letters, vol. 100, Feb. 24, 2012, pp. 082111-082111-3, in 3 pages.
Erley, G. et al., "Silicon interband transitions observed at Si(100)-$SiO_2$ interfaces", Physical Review B, vol. 58(4), Jul. 15, 1998, pp. R1734-R1737, in 4 pages.
Geiger, F., "Second Harmonic Generation, Sum Frequency Generation and X(3): Dissecting Environmental Interfaces with a Nonlinear Optical Swiss Army Knife", Annual Review of Physical Chemistry, vol. 60(1), Nov. 2008, pp. 61-83, in 25 pages.
Gielis, J. J. H. et al., "Optical second-harmonic generation in thin film systems", Journal of Vacuum Science Technology A, vol. 26(6), Nov./Dec. 2008, pp. 1519-1537, in 20 pages.
Glinka, Y. D. et al., "Ultrafast dynamics of interfacial electric fields in semiconductor heterostructures monitored by pump-probe second-harmonic generation", Applied Physics Letter, vol. 81(20), Nov. 11, 2002, pp. 3717-3719, in 3 pages.
Heinz, T. F. et al., "Optical Second-Harmonic Generation from Semiconductor Surfaces", Advances in Laser Science III, edited by A. C. Tam, J. L. Cole and W. C. Stwalley (American Institute of Physics, New York, 1988) p. 452, in 8 pages.
Istratov, a. et al., "Exponential analysis in physical phenomena", Review of Scientific Instruments, vol. 70(2), Feb. 1999, pp. 1233-1257, in 25 pages.
Jun, H. et al., "Charge Trapping in Irradiated Soi Wafers Measured by Second Harmonic Generation", IEEE Transactions on Nuclear Science, vol. 51(6), Dec. 2004, pp. 3231-3237, in 8 pages.
Katsube, T. et al., "Memory Traps in MNOS Diodes Measured by Thermally Stimulated Current", Solid State Electronics, vol. 19(1), Jan. 1976, pp. 11-16, in 6 pages.
Lantz, J. et al., "Time-Resolved Optical Second Harmonic Generation Measurements of Picosecond Band Flattening Processes at Single Crystal Ti02 Electrodes", The Journal of Physical Chemistry, vol. 98(38), Sep. 1994, pp. 9387-9390, in 4 pages.
Lei, M. et al., "Hot carrier injection from nanometer-thick silicon-on-insulator films measured by optical second harmonic generation", Applied Physics Letters, vol. 96, Jul. 2010, pp. 241105-241105-3, in 3 pages.
Lundstrom, I. et al., "Tunneling to traps in insulators", Journal of Applied Physics, vol. 43(12), Dec. 1972, pp. 5045-5047, in 4 pages.
Lupke, G. et al., "Electron Trapping in Ultrathin $SiO_2$ on Si(001) Probed by Electric-Field-Induced Second-Harmonic Generation", IEEE Nonlinear Optics: Materials, Fundamentals and Applications-Conference Proceedings, MC22, Aug. 1998, pp. 89-91, in 3 pages.
Mandoc, M. M. et al., "Corona Charging and Optical Second-Harmonic Generation Studies of the Field-Effect Passivation of c-Si by Al2O3 Films", IEEE, Jul. 2010, in 5 pages.
Marano, S. et al., "Sequential Detection of Almost-Harmonic Signals", IEEE Transactions on Signal Processing, vol. 51(2), Feb. 2003, pp. 395-406, in 12 pages.
Marka, Z. et al., "Band offsets measured by internal photo-emission-induced second-harmonic generation", Physical Review B, vol. 67(4), Jan. 2003, pp. 045302-045302-5, in 6 pages.
Marka, Z. et al., "Characterization of X-Ray Radiation Damage in Si/$SiO_2$ Structures Using Second-Harmonic Generation", IEEE Transactions on Nuclear Science, vol. 47(6), Dec. 2000, pp. 22562261, in 6 pages.

(56) References Cited

OTHER PUBLICATIONS

Marka, Z. et al., "Two-color optical technique for characterization of x-ray radiation-enhanced electron transport in $SiO_2$", Journal of Applied Physics, vol. 93(4), Feb. 15, 2003, pp. 1865-1870, in 6 pages.
Murzina, T. et al., "Optical Second Harmonic Generation in Semiconductor Nanostructures", Physics Research International, vol. 2012, Mar. 16, 2012, in 12 pages.
Neethling, P. H. et al., "Second harmonic generation as a technique to probe buried interfaces", South African Journal of Science, vol. 105, Jul./Aug. 2009, pp. 282-284, in 3 pages.
Pasternak, R. et al., "Laser detection of radiation enhanced electron transport in ultra-thin oxides", Nuclear Instruments and Methods in Physics Research A, vol. 514, 2003, pp. 150-155, in 6 pages.
Pedersen, K. et al., "Spectroscopic second-harmonic generation from silicon-on-insulator wafers", Optical Society of America, vol. 26(5), May 2009, pp. 917-922, in 6 pages.
Powell, R. D., "The Use of Photoinjection to Determine Oxide Charge Distributions and Interface Properties in MOS Structures", IEEE Transactions on Nuclear Sciences, vol. 17(6), Jan. 1971, pp. 41-46, in 6 pages.
Price, J. J et al.' "Optical second-harmonic generation study of charge trapping dynamics in $HfO_2$ /$SiO_2$ films on Si(100)", Physica Status Solidi, vol. 5(8), Jun. 2008, pp. 2667-2670, in 4 pages.
Rai, V. N. et al., "A transistorized Marx bank circuit providing sub-nanosecond high-voltage pulses", Measurement Science and Technology, vol. 5(4), Nov. 1993, pp. 447-449, in 3 pages.
Reber, R. et al., "Thermally stimulated current measurements of $SiO_2$ defect density and energy in irradiated metal-oxide-semiconductor capacitors", Review of Scientific Instruments, vol. 63(12), Jun. 4, 1998, pp. 5714-5725, in 13 pages.
Robertson, J., "Band offsets of wide-band-gap oxides and implications for future electronic devices", Journal of Vacuum Science and Technology B, vol. 18(3), May 2000, pp. 1785-1791, in 7 pages.
Schaller, R. D. et al., "Time-Resolved Second Harmonic Generation Near-Field Scanning Optical Microscopy", Chemphyschem, vol. 4(11), Nov. 14, 2003, pp. 1243-1247, in 5 pages.
Taguchi, D. et al., "Probing of carrier behavior in organic electroluminescent diode using electric field induced optical second-harmonic generation measurement", Applied Physics Letters, vol. 95, Dec. 30, 2009, pp. 263310-263310-3, in 4 pages.
Ushiki, T. et al., "Evidence of Energetically-Localized Trap-States at SOI-Box Interface in High-Dose Simox Wafers", IEEE International Soi Conference, Oct. 1999, pp. 48-49, in 2 pages.
Vanbel, M. K. et al., "Electric-Field-Induced Second-Harmonic Generation Demonstrates Different Interface Properties of Molecular Beam Epitaxy Grown MgO on Si", the Journal of Physical Chemistry, vol. 118(4), Jan. 2014, in 6 pages.
Vanbel, M. K. et al., "Tunneling of holes is observed by second-harmonic generation", Applied Physics Letters, vol. 102(8), Feb. 2013, in 5 pages.
Wang, H. et al., "Non-degenerate fs pump-probe study on InGaN with multi-wavelength second-harmonic generation", Optics Express, Jul. 11, 2005, vol. 13(14), pp. 5245-5252, in 8 pages.
Wang, W. et al., "Coupled Electron-Hole Dynamics at the Si/$SiO_2$ Interface", Physical Review Letters, vol. 81(19), Nov. 9, 1998, pp. 4224-4227, in 4 pages.
White, Y. V. et al., "Studies of charge carrier trapping and recombination processes in Si $SiO_2$ MgO structures using second-harmonic generation", Applied Physics Letters, vol. 88, Feb. 2006, pp. 062102-062102-3, in 3 pages.
Xiao, D. et al., "Optical probing of a silicon integrated circuit using electric-field-induced second-harmonic generation", Applied Physics Letters, vol. 88, Mar. 17, 2006, pp. 114107-114107-3, in 4 pages.
Chinese Office Action dated Mar. 20, 2020 in corresponding CN Application No. 201680064010.9.
European Extended Search Report dated Sep. 28, 2017 in corresponding EP Application No. 15779557.6.
European Interview Summary Report dated Apr. 28, 2020 in corresponding EP Application No. 15779557.6.
European Office Action dated May 4, 2020 in corresponding EP Application No. 15779557.6.
European Extended Search Report dated Apr. 3, 2018 in corresponding EP Application No. 15858539.8.
European Office Action dated Aug. 30, 2019 in corresponding EP Application No. 15858539.8.
Invitation to Pay Addition Fees and Partial Search Report dated Jul. 27, 2015 in corresponding PCT Application No. PCT/US2015/026263.
International Search Report and Written Opinion dated Sep. 23, 2015 in corresponding PCT Application No. PCT/US2015/026263.
International Preliminary Report on Patentability and Written Opinion dated Oct. 27, 2016 in corresponding PCT Application No. PCT/US2015/026263.
International Search Report and Written Option dated Feb. 26, 2016 in corresponding PCT Application No. PCT/US2015/060437.
International Preliminary Report on Patentability and Written Opinion dated May 26, 2017 in corresponding PCT Application No. PCT/US2015/060437.
International Search Report and Written Option dated Aug. 13, 2019 in corresponding PCT Application No. PCT/US2019/029485.
International Search Report and Written Opinion dated Sep. 25, 2019 in corresponding PCT Application No. PCT/US2019/032282.
International Search Report and Written Option dated Aug. 8, 2019 in corresponding PCT Application No. PCT/US2019/029439.
Taiwanese Office Action dated Sep. 28, 2017 in corresponding Taiwan Application No. 105131588.
Taiwanese Office Action dated Feb. 10, 2020 in corresponding Taiwan Application No. 105131588.
U.S. Office Action dated Feb. 8, 2017 in corresponding U.S. Appl. No. 14/690,179.
U.S. Office Action dated Aug. 28, 2017 in corresponding U.S. Appl. No. 14/690,179.
U.S. Office Action dated Jan. 14, 2019 in corresponding U.S. Appl. No. 15/882,433.
U.S. Office Action dated Jul. 25, 2019 in corresponding U.S. Appl. No. 15/882,433.
U.S. Office Action dated Nov. 6, 2019 in corresponding U.S. Appl. No. 15/882,433.
U.S. Office Action dated Oct. 13, 2016 in corresponding U.S. Appl. No. 14/690,256.
U.S. Office Action dated Jul. 28, 2017 in corresponding U.S. Appl. No. 14/690,256.
U.S. Office Action dated Oct. 31, 2018 in corresponding U.S. Appl. No. 15/880,308.
U.S. Office Action dated May 1, 2017 in corresponding U.S. Appl. No. 14/690,251.
U.S. Office Action dated Jun. 25, 2018 in corresponding U.S. Appl. No. 15/799,594.
U.S. S Office Action dated Apr. 17, 2019 in corresponding U.S. Appl. No. 15/799,594.
U.S.Office Action dated Sep. 5, 2019 in corresponding U.S. Appl. No. 15/799,594.
U.S. Office Action dated Jan. 7, 2020 in corresponding U.S. Appl. No. 15/799,594.
U.S. Office Action dated Oct. 7, 2016 in corresponding U.S. Appl. No. 14/690,279.
U.S. Office Action dated May 8, 2017 in corresponding U.S. Appl. No. 14/690,279.
U.S. Office Action dated Sep. 18, 2018 in corresponding U.S. Appl. No. 15/806,271.
U.S. Office Action dated Mar. 29, 2019 in corresponding U.S. Appl. No. 15/806,271.
U.S. Office Action dated Oct. 28, 2019 in corresponding U.S. Appl. No. 15/806,271.
U.S.Office Action dated Feb. 5, 2018 in corresponding U.S. Appl. No. 14/939,750.
U.S. Office Action dated Jun. 26, 2018 in corresponding U.S. Appl. No. 14/939,750.
U.S. Office Action dated Feb. 13, 2019 in corresponding U.S. Appl. No. 14/939,750.
U.S. Office Action dated Sep. 24, 2019 in corresponding U.S. Appl. No. 14/939,750.

(56) References Cited

OTHER PUBLICATIONS

U.S. Office Action dated Jun. 17, 2020 in corresponding U.S. Appl. No. 16/412,216.

* cited by examiner

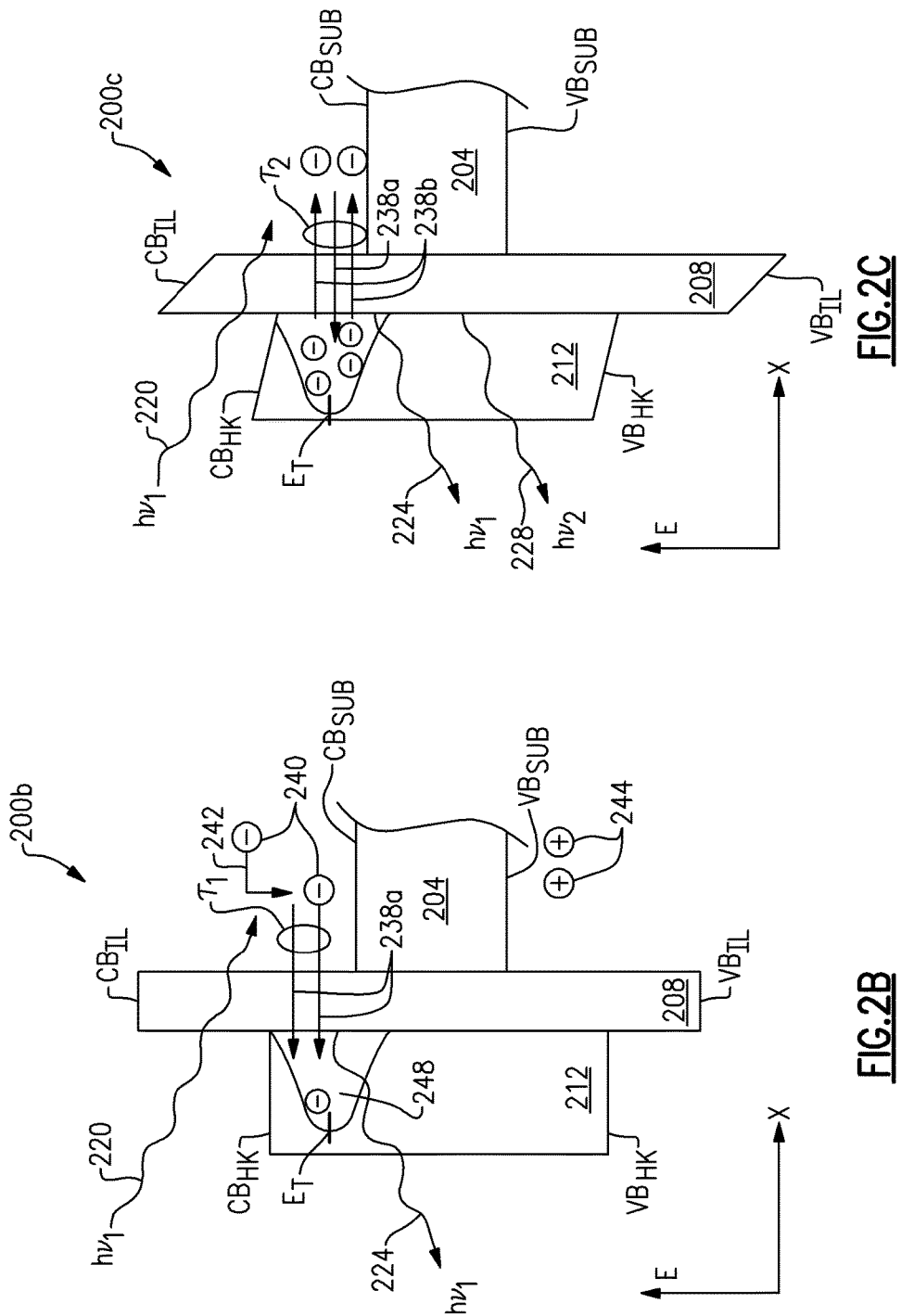

OPTICAL SYSTEMS AND METHODS OF CHARACTERIZING HIGH-K DIELECTRICS

STATEMENT REGARDING FEDERALLY SPONSORED R&D

The invention described herein was made in the performance of work under a NASA contract NNN12AA01C, and is subject to the provisions of Public Law 96-517 (35 USC 202) in which the Contractor has elected to retain title.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The disclosed technology generally relates to characterization of semiconductor structures, and more particularly to optical characterization of high-k dielectrics.

Description of the Related Art

As feature sizes of complementary metal-oxide-semiconductor (CMOS) technologies continue to scale, performance demands on various elements of metal-oxide-semiconductor (MOS) transistors continue to increase. One such element is the gate dielectric of the MOS transistor, where continued scaling of the physical thickness of thermally grown $SiO_2$-based gate dielectrics has recently led to unacceptable current leakage. In response, tremendous efforts have been devoted to investigate high-permittivity (high-k) dielectrics to succeed the $SiO_2$-based gate dielectrics in the MOS transistors. Higher dielectric constants of the high-k dielectrics provide higher gate capacitances for a given thickness of the gate dielectric. As a result, by using high-k dielectrics, for a given gate capacitance, the gate dielectric can have a higher physical thickness, thereby enabling reduced leakage currents. Many high-k dielectrics have been investigated as candidates to succeed the $SiO_2$-based gate dielectrics including, e.g., $Al_2O_3$-based and $HfO_2$-based high-k dielectrics, both of which have been relatively popular owing to the larger permittivity as well their thermodynamic stability in contact with silicon.

Despite the need for high-k dielectrics, electrical characteristics of some high-k dielectrics pose challenges for integrating them into advanced MOS transistors. For example, structural defects, including negative fixed charge, interface states and charge trapping centers have limited the use of some high-k dielectrics because such defects can give rise to various device performance and reliability concerns, including negative bias temperature instability, threshold voltage shifts and gate leakage, to name a few. Thus, for further research and development as well as for manufacturing, fast, quantitative and non-destructive methods and systems for characterizing the structural defects in high-k dielectrics are becoming increasingly important. However, existing characterization techniques have certain drawbacks. For example, while certain electrical characterization techniques, e.g., capacitance-voltage (CV) measurements and current-voltage (IV) can be used characterize some electrically active structural defects, many of them are performed on fabricated device structures, which can be time consuming and difficult to implement in-line as part of a manufacturing process flow. In addition, while certain physical and optical characterization techniques, e.g., X-ray photo electron spectroscopy (XPS), secondary ion mass spectrometry (SIMS), Fourier transform infrared spectroscopy (FTIR) and optical absorption/emission spectroscopies, can be used characterize some structural defects, many of them yield chemical or optical information about the structural defects, which may or may not correspond to electrically active defects that give rise to the undesirable device or reliability concerns. In addition, many techniques are destructive, time consuming and/or difficult to implement in-line as part of a manufacturing process flow. Thus, there is a need for characterization techniques for quantifying electrically active defects in high-k dielectrics that are fast, non-destructive and easy to implement in-line as part of a manufacturing process flow.

SUMMARY

In one aspect, a method of characterizing a semiconductor structure includes providing a semiconductor structure comprising a semiconductor and a high-k dielectric layer formed over the semiconductor, wherein the high-k dielectric layer has electron traps formed therein. The method additionally includes at least partially transmitting an incident light having an incident energy through the high-k dielectric layer and at least partially absorbing the incident light in the semiconductor. The incident energy is sufficient to cause electrons to be transported from the semiconductor to the electron traps such that some of the electrons are temporarily trapped by the electron traps. The incident energy is sufficient for the electron traps filled with temporarily trapped electrons to cause generation of light having energy different from the incident energy resulting from nonlinear optical effects. The method additionally includes measuring a spectrum resulting from the light having the energy different from the incident energy, the nonlinear optical spectrum having a first region and a second region, wherein the first region changes at a different rate in intensity compared to the second region. The method further includes determining from the spectrum one or both of a first time constant from the first region and a second time constant from the second region, and determining a trap density in the high-k dielectric layer based on the one or both of the first time constant and the second time constant.

In another aspect, a method of characterizing a semiconductor structure includes providing a semiconductor structure comprising a semiconductor substrate and a high-k dielectric layer formed over the substrate, wherein the dielectric layer has electron traps formed therein. The method additionally includes at least partially transmitting an incident light having an incident energy through the high-k dielectric layer and at least partially absorbing the incident light in the semiconductor substrate. The incident energy is sufficient to cause electrons to be transported from the semiconductor substrate to the electron traps such that some of the electrons are temporarily trapped by the electron traps. The incident energy is also sufficient to cause second harmonic generation (SHG) by the traps filled with temporarily trapped electrons. The method additionally includes measuring a second harmonic spectrum resulting from the second harmonic generation, the second harmonic spectrum having a first region and a second region, wherein the first region increases at a faster rate in intensity compared to the second region. The method further includes determining from the second harmonic spectrum one or both of a first time constant from the first region and a second time constant from the second region, and determining a trap density in the high-k dielectric layer based on the one or both of the first time constant and the second time constant.

In another aspect, a system for characterizing a semiconductor structure comprises a light source configured emit an incident light having an incident energy that is at least partially transmitted through a high-k dielectric layer formed on a semiconductor substrate and at least partially absorbed by the semiconductor substrate, wherein the high-k dielectric layer has electron traps formed therein. The incident energy is sufficient to cause electrons to be transported from the semiconductor substrate to the electron traps such that some of the electrons are temporarily trapped by the electron traps. The incident energy is sufficient for the electron traps filled with temporarily trapped electrons to cause generation of light having an energy different from the incident energy resulting from nonlinear optical effects, The system additionally includes a detector configured to measure a spectrum resulting from the light having the energy different from the incident energy, the nonlinear optical spectrum having a first region and a second region, wherein the first region increases at a faster rate in intensity compared to the second region. The system further includes electronics configured to determine from the second harmonic spectrum one or both of a first time constant from the first region and a second time constant from the second region, and further configured to determine a trap density in the high-k dielectric layer based on the one or both of the first time constant and the second time constant.

In another aspect, a system for characterizing a semiconductor structure comprises a light source configured emit an incident light having an incident energy that is at least partially transmitted through a high-k dielectric layer formed on a semiconductor substrate and at least partially absorbed by the semiconductor substrate, wherein the high-k dielectric layer has electron traps formed therein. The incident energy is sufficient to cause electrons to be transported from the semiconductor substrate to the electron traps such that some of the electrons are temporarily trapped by the electron traps. The incident energy is also sufficient to cause second harmonic generation (SHG) by the electron traps filled with temporarily trapped electrons. The system additionally comprises a detector configured to measure a second harmonic spectrum resulting from the second harmonic generation, wherein the second harmonic spectrum has a first region and a second region, and wherein the first region increases at a faster rate in intensity compared to the second region. The system further comprises a time constant determining unit configured to determine from the second harmonic spectrum one or both of a first time constant from the first region and a second time constant from the second region, and further comprises a trap density determining unit configured determine a trap density in the high-k dielectric layer based on the one or both of the first time constant and the second time constant.

BRIEF DESCRIPTION OF THE DRAWINGS

FIGS. 2B and 2C schematically illustrate energy band diagrams of the semiconductor structure illustrated in FIG. 2A, during different stages of implementation of the method illustrated in FIG. 1, according to embodiments.

DETAILED DESCRIPTION

Various embodiments describe herein are aimed at addressing the need for a characterization technique for quantifying electrically active structural defects, or traps, in high-k dielectrics that are advantageously fast, non-destructive and easy to implement in-line as part of a manufacturing process flow for fabricating semiconductor devices. In particular, the embodiments exploit nonlinear optical effects in solids caused by lasers.

Generally, without subscribing to any scientific theory, nonlinear optical effects may arise in solids as a beam of light propagates therethrough, as the electromagnetic radiation interacts with electric dipoles formed by nuclei and associated electrons of the atoms in the solids. The electromagnetic radiation interacts with the dipoles and causes them to oscillate, which results in the dipoles themselves acting as sources of electromagnetic radiation. When the amplitude of vibration is small, the dipoles emit radiation of the same frequency as the incident radiation. Under some circumstances according to embodiments described herein in which the irradiance of the radiation is relatively high, however, the relationship between irradiance and amplitude of vibration becomes nonlinear, resulting in the generation of harmonics of the frequency of the radiation emitted by the oscillating dipoles. That is, frequency doubling or second harmonic generation (SHG), and even higher order frequency effects occur as the incident irradiation is relatively increased. The electric polarization (or dipole moment per unit volume) P can be expressed as a power series expansion in the applied electric field E by:

$$P = \varepsilon_0(\chi E + \chi_2 E^2 + \chi_3 E^3 + \ldots). \quad [1]$$

In Eq. [1], $\chi$ is the linear susceptibility and $\chi_2, \chi_3, \ldots$ are the nonlinear optical coefficients. When the applied field can be expressed in the sinusoidal form $E = E_0 \sin \omega t$ such as produced by an electromagnetic wave, Eq. [1] can be expressed as:

$$P = \varepsilon_0 \left( \chi E_0 \sin \omega t + \frac{1}{2} \chi_2 E_0^2 (1 - \cos 2\omega t) + \ldots \right). \quad [2]$$

In Eq. [2], the term $2\omega$ corresponds to an electromagnetic wave having twice the frequency of the incident wave. The magnitude of the term in $2\omega$ starts to become significant when the electric field becomes relatively large, as can be achieved with lasers. SHG can be observed in solids that do not possess a center symmetry. In symmetric solids, an applied electric field produces polarization of the same magnitude but of opposite sign according to whether the electric field is positive or negative and as a result, little or no net polarization occurs. As a result, some semiconductors, e.g., silicon, which has a center symmetry, do not exhibit SHG. However, as advantageously utilized by embodiments described herein, electric fields across interfaces between semiconductors and dielectrics can exhibit SHG.

Figure 1:
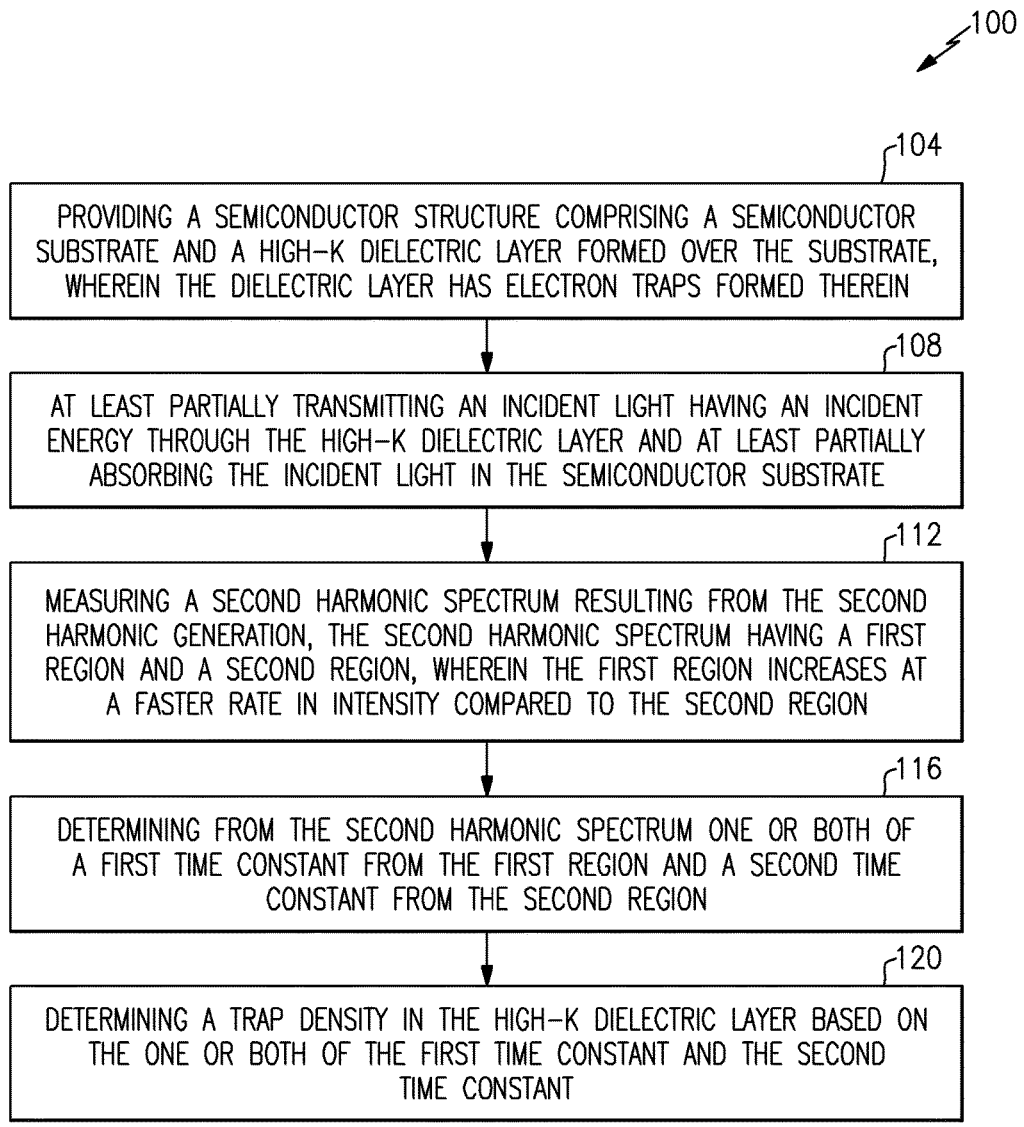
FIG. 1 is a flow chart illustrating a method of characterizing structural defects in high-k dielectrics based on second harmonic generation (SHG), according to embodiments.

Method and System of Characterizing Traps in High-K Dielectrics Based on Second Harmonic Generation FIG. 1 illustrates a method 100 of characterizing structural defects in high-k dielectrics based on second harmonic generation, according to embodiments. The method 100 is described in conjunction with FIG. 2A, which illustrates a schematic arrangement of a system 200a configured to implement the method 100, according to various embodiments. For clarity, a detailed description of various optical components of according to embodiments is provided in reference to FIG. 2A.

The method 100 includes providing 104 a semiconductor structure comprising a semiconductor substrate and a high-k dielectric layer formed over the substrate, wherein the dielectric layer has charge carrier traps formed therein. The method 100 additionally includes at least partially transmitting 108 incident light having an incident energy through the high-k dielectric layer and at least partially absorbing the incident light in the semiconductor substrate. According to embodiments, the incident energy is sufficient to cause electrons to be transported from the semiconductor substrate to the electron traps such that some of the electrons are temporarily trapped by the electron traps. In addition, the incident energy is sufficient to cause second harmonic generation (SHG) by the electron traps filled with temporarily trapped electrons. The method 100 additionally includes measuring 112 a second harmonic spectrum resulting from the second harmonic generation, the second harmonic spectrum having a first region and a second region, wherein the first region increases at a faster rate in intensity compared to the second region. The method 100 further includes determining 116 from the second harmonic spectrum one or both of a first time constant from the first region and a second time constant from the second region, and determining 120 a trap density in the high-k dielectric layer based on the one or both of the first time constant and the second time constant.

Figure 2A:
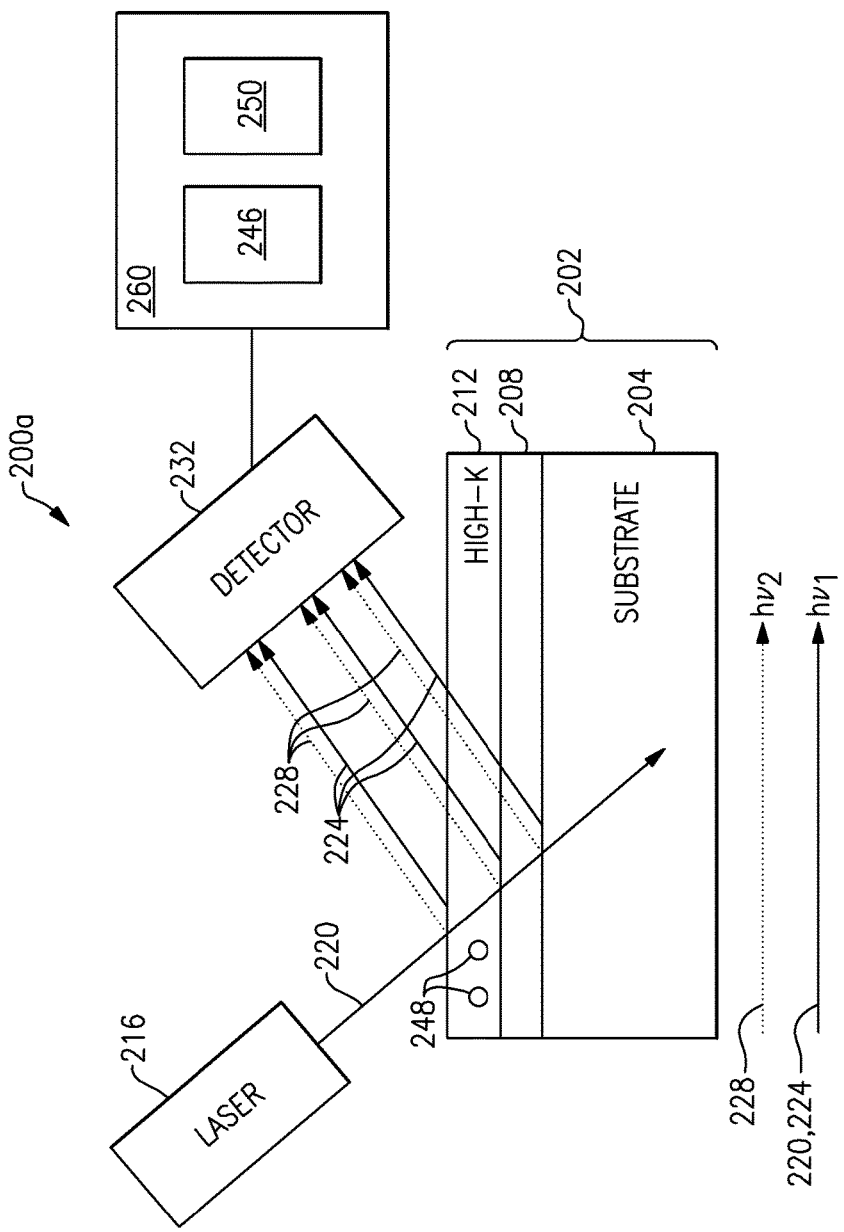
FIG. 2A schematically illustrates a system for characterizing structural defects in high-k dielectrics based on SHG, according to embodiments.

FIG. 2A schematically illustrates a system 200a for characterizing structural defects in high-k dielectrics based on SHG, according to embodiments. The system 200a includes a semiconductor structure 202 comprising a semiconductor substrate 204 and a high-k dielectric layer 212 formed over the substrate 204, where the high-k dielectric layer 212 has electrically active structural defects, or traps 248 formed therein to be characterized.

As described herein and throughout the specification, the semiconductor substrate 204 on which the high-k dielectric layer 212 can be implemented in a variety of ways, including, but not limited to, an n-doped or a p-doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials.

According to certain embodiments, the substrate 204 can be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer. In addition, he various structures described herein can be at least partially formed in an epitaxial layer formed at or near a surface region.

Furthermore, according to certain embodiments, the illustrated semiconductor structure 202 may be an intermediate device structures having certain regions formed therein, such that, subsequent to implementation of the method 100 (FIG. 1) as part of an in-line characterization process, the semiconductor structure 202 can be further processed to form a functional MOS transistor. In these embodiments, the semiconductor structure 202 may have doped regions such as heavily doped regions that when further processed, can serve as source and/or drain regions of a functional MOS transistor or other devices. The semiconductor structure 202 may further have isolation regions, e.g., shallow trench isolation regions. In other embodiments, the illustrated semiconductor structure 202 may be a monitor structure having the high-k dielectric layer 212 formed thereon for the purposes of characterizing the structural defects formed therein for the purpose of, e.g., monitoring the health of a manufacturing tool or a line.

Furthermore, while the illustrated semiconductor structure 202 is illustrated as being a planar structure, embodiments are not so limited. For example, the structure 202 may include a semiconductor substrate 204 having isolation regions formed therein and a fin-shaped semiconductor structure protruding vertically above the isolation regions, which can be further processed to form fin-shaped field effect transistors (FinFETs). In these implementations, the high-k dielectric layer 212 may wrap around the fin-shaped semiconductor structure.

As described herein and throughout the disclosure, a high-k dielectric refers to a dielectric material having a dielectric constant greater than that of $SiO_2$. Thus, according to various embodiments, the high-k dielectric layer 212 may be a k-value greater than about 4, greater than about 8 or greater than about 15. According to various embodiments, the high-k dielectric layer 212 can be formed of $Si_3N_4$, $Ta_2O_5$, $SrTiO_3$, $ZrO_2$, $HfO_2$, $Al_2O_3$, $La_2O_3$, $Y_2O_3$, $HfSiO_4$ and $LaAlO_3$, including non-stoichiometric versions of the above and various mixtures thereof, as well combinations or stacks or nanolaminates thereof, to name a few.

Still referring to FIG. 2A, in the illustrated embodiment, an interfacial layer 208 is formed between the substrate 204 and the high-k dielectric layer 212. When the high-k dielectric layer 212 is formed of $HfO_2$ and the substrate 204 is formed of a silicon substrate, the interfacial layer 212 can be formed of, e.g., $SiO_x$ or $HfSiO_x$. The interfacial layer 208 can be formed unintentionally under some circumstances from oxygen precursors that diffuse to the high-k dielectric/substrate interface during the growth of the high-k dielectric layer 212 and/or bulk diffusion of excess oxygen atoms present in the high-k dielectric layer 212 during or after growth of the high-k dielectric layer 212. In some embodiments, the interfacial layer 208 may be an intentionally grown $SiO_2$ layer to suppress the spontaneous growth of an interfacial oxide, and/or to provide better control of the properties of the interfacial layer and to provide a more stable surface for nucleation of the $HfO_2$. However, embodiments are not so limited and in some embodiments, the interfacial layer 208 may be omitted.

According to embodiments, the high-k dielectric layer 212 has structural defects, or traps 248 formed therein that are to be characterized using the methods and systems described herein. The defects 248 can be point defects, e.g., missing or extra atoms of the high-k layer 212. For example, where the high-k layer 212 is formed of an oxide or an oxynitride, the traps 248 can include oxygen vacancies, which correspond to missing oxygen atoms, or interstitial oxygen atoms, which correspond to extra oxygen atoms. Where the traps 248 comprise vacancies, the traps 248 can be charged or neutral. For example, oxygen vacancies in $HfO_2$ may exist in one of five charge states, namely +2, +1, 0, −1, and −2.

Still referring to FIG. 2A, the system 200a includes a light source 216, which can be a first light source comprising a laser, a lamp and/or light-emitting diode(s), among other light sources configured to direct incident light 220 having an incident energy $hv_1$ to the semiconductor structure 202 and at least partially propagate or transmit through the high-k dielectric layer 212 and further through the interfacial layer 208 when present. The light source 216 is further configured such that the incident light 220 is at least partially absorbed by the semiconductor substrate 204 to impart energy to the substrate 204 to cause elastic or inelastic processes therein. In particular, the light source 216 is configured to emit a monochromatic incident light 220 such that the partially transmitted incident light 220 having the incident energy is sufficient to cause charge carriers (e.g., electrons) to be at least transported from the semiconductor substrate to the traps 248 having a capture cross section σ such that some of the charge carriers are temporarily trapped by the traps 248.

In various embodiments, the light source 216 may operate in a wavelength range that is suitable for electron traps filled with temporarily trapped electrons to cause generation of light having an energy different from an incident energy resulting from nonlinear optical effects. For example, the light source 216 may operate in a range between about 700 nm to about 2000 nm with a peak power between about 10 kW and 1 GW, according to embodiments.

In various embodiments, the light source 216 may provide an intensity or a power density that is suitable for electron traps filled with temporarily trapped electrons to cause generation of light having an energy different from an incident energy resulting from nonlinear optical effects. For example, the light source 216 may be configured to deliver an average power between about 10 mW and 10 about W or between about 100 mW and about 1 W, for instance about 300 mW.

Still referring to FIG. 2A, according to embodiments, the incident light 220 having the incident energy is sufficient to cause SHG by the traps filled with charge carriers. As discussed supra, harmonic generation can be observed in solids that do not possess a center symmetry. Without subscribing to any scientific theory, even if the semiconductor substrate 204 has a center symmetry, e.g., as in silicon having a diamond cubic structure, net polarization can occur across semiconductor/dielectric interfaces when traps 248 are present in dielectric layer(s) formed over the semiconductor substrate 204, according to:

$$I^{2\omega}(t)=|\chi_2+\chi_3 E(t)|^2 (I^\omega)^2. \qquad [3]$$

In Eq. [3], $I^\omega$ and $I^{2\omega}$ are the fundamental and second harmonic generation signal intensities, respectively, and $\chi_2$ and $\chi_3$ are the second-order and third-order susceptibilities, and E(t) is the electric field across the interface. Thus, upon at least some of the structural defects or traps having captured charge carriers (e.g., electrons) therein, SHG occurs, thereby generating SHG light 228 having double the frequency of the incident light 220.

Still referring to FIG. 2A, the system 200a further includes a detector 232 configured to measure a second harmonic spectrum resulting from the SHG light 228 having twice the energy of the incident light 220, and may also be configured to further measure or filter out reflected light 224 having the same energy as the incident light 220, according to embodiments. The detector 232 may be a photomultiplier tube, a CCD camera, an avalanche detector, a photodiode detector, a streak camera and a silicon detector, among other types of detectors.

While in the illustrated embodiment, the light source 216 is shown as a sole light source, which can serves as a pump as well as a probe for generating as well as measuring the SHG light 228, embodiments are not so limited. In other embodiments, a separate second light source (not shown), which can be a laser or a lamp, may be provided. In these embodiments, the light source 216 may serve as one of a pump or a probe, while the second light source may serve as the other of the pump or the probe. In various embodiments, the second light source, when present, may operate in a wavelength range between about 80 nm and about 800 nm delivering an average power between about 10 mW and 10 W, according to embodiments.

While not explicitly illustrated for clarity, the system 200a may include various other optical elements. For example, the system 200a may include: a photon counter; a reflective or refractive filter for selectively passing the SHG signal; a prism to differentiate the weaker SHG signal from the many-orders-of-magnitude-stronger reflected primary beam; a diffraction grating or a Pellicle beam splitter; an optical bundle for focusing and collimating/collimation optics; a filter wheel, zoom lens and/or polarizers.

Examples of various optical components and their arrangements described above with respect to FIG. 2A, as well as variations thereof, are also described in each of U.S. application Ser. No. 14/690,179 filed on Apr. 17, 2015 and titled "Pump and Probe Type Second Harmonic Generation Metrology;" U.S. application Ser. No. 14/690,256 filed on Apr. 17, 2015 and titled "Charge Decay Measurement Systems and Methods;" U.S. application Ser. No. 14/690,251 filed on Apr. 17, 2015 and titled "Field-Based Second Harmonic Generation Metrology;" U.S. application Ser. No. 14/690,279 filed on Apr. 17, 2015 and titled "Wafer Metrology Technologies;" and U.S. application Ser. No. 14/939,750 filed on Nov. 12, 2015 and titled "Systems for Parsing Material Properties From Within SHG Signals." The content of each is incorporated by reference herein in its entirety.

The system 200a further includes electronics or a time constant determining unit 246 configured to determine from the second harmonic spectrum one or both of a first time constant ($\tau_1$) in the first region of the second harmonic spectrum that can be associated at least with a trapping rate of electrons by the traps 248, and a second time constant ($\tau_2$) in the second region of the second harmonic spectrum that can be associated at least with a detrapping rate of electrons from the traps 248.

The system 200a further includes electronics or a trap density determining unit 250 configured to determine a density of charge carrier traps in the high-k dielectric layer 212 based on the one or both of the first time constant and the second time constant.

The time constant determining unit 246 and the trap density determining unit 250 may be part of an electronic device 260, which may be a computing device, e.g., a field programmable gate array (e.g., FPGA), specially adapted for implementing the methods disclosed herein, as described more in detail infra. The electronic device 260 can be a computing device, a computer, a tablet, a microcontroller or a FPGA. The electronic device 260 includes a processor or processing electronics that may be configured to execute one or more software modules. In addition to executing an operating system, the processor may be configured to execute one or more software applications, including a web browser, a telephone application, an email program, or any other software application. The electronic device 246 can implement the methods discussed herein by executing instructions included in a machine-readable non-transitory storage medium, such as a RAM, ROM, EEPROM, etc. The electronic device 246 can include a display device and/or a graphic user interface to interact with a user. The electronic device 246 can communicate with one or more devices over a network interface. The network interface can include transmitters, receivers and/or transceivers that can communicate over wired or wireless connections.

FIG. 2B illustrates a schematic energy band diagram 200b of the semiconductor structure of the system 200a illustrated in FIG. 2A. In particular, the illustrated energy band diagram 200b corresponds to initial stages of measuring the SHG spectrum, e.g., the first region of the SHG spectrum.

In the energy band diagram 200b, the high-k layer 212 has formed therein structural defects or traps 248 (represented as a distribution curve), which may be point defects as described above. The traps 248 may have a distribution of energy levels about a peak and/or a centroid having an energy level $E_T$. In some embodiments, the traps 248 may be distributed throughout the thickness of the high-k layer 212, while in other embodiments, the defects may be locally concentrated, e.g., near a high-k/semiconductor interface when the interlayer 208 is not present, or a high-k/interlayer interface when the interlayer 208 is present. The structural defects 248 are configured to trap electrons transported from the semiconductor substrate 204, according to some embodiments.

As described supra, upon being transmitted through the high-k layer 212 and further through the interfacial layer 208 when present, the incident light having an energy $hv_1$ is partially absorbed in the semiconductor substrate 204 having a conduction band edge ($CB_{SUB}$) and a valence band edge ($VB_{SUB}$).

In embodiments where the semiconductor substrate 204 is undoped, relatively lightly doped (e.g., less than about $1 \times 10^{14}/cm^3$) or p-doped, a relatively small concentration of electrons may be present in the conduction band. In these embodiments, the energy $hv_1$ of the incident light 220 may be chosen such that $hv_1$ is greater than the band gap of the semiconductor substrate 204 by at least 0.1 eV or by at least 0.3 eV, such that electrons 240 (and/or holes 244) can be generated in the semiconductor substrate 204, to be transferred into the high-k dielectric layer to be trapped by the traps 248. For example, when the semiconductor substrate 204 is silicon, the energy $hv_1$ of the incident light 220 is greater than the band gap of silicon at 1.12 eV (1110 nm) such that a sufficient amount of electrons 240 are populated in the conduction band. For example, the incident light may be 1.2 eV or greater.

On the other hand, in embodiments where the semiconductor substrate 204 is relatively highly n-doped (e.g., greater than about $1 \times 10^{14}/cm^3$), the energy $hv_1$ of the incident light 220 need not be greater than the band gap of the semiconductor substrate 204. Instead, because the conduction band of the semiconductor 204 is already substantially populated with electrons 240, the energy $hv_1$ of the incident light 220 may impart additional energy to the electrons populated in the conduction band to be transferred into the high-k dielectric layer to be trapped by the traps 248.

Without subscribing to any scientific theory, once populated in the conduction band of the semiconductor substrate 204, the electrons 240 may be transported through the thickness of the interlayer 208 when present, and/or at least partially through the thickness of the high-k dielectric layer 212, to be trapped by the structural defects or traps 248, as indicated by the arrows 238a.

Without subscribing to any scientific theory, the electrons 240 may be transferred tunneling, e.g., directly tunneling or trap-assisted tunneling, from the conduction band of the substrate 204 into an energy level within the distribution of energy of traps 248. Direct tunneling of electrons is a quantum mechanical phenomenon, whose probability depends on the physical barrier thickness and height to be tunneled through by the electron, among other factors. Thus, the probability of tunneling is relatively higher when the potential barrier thickness and/or height are smaller. Generally, an initial state (in the substrate 204) is at a higher potential than a final state (high-k dielectric layer 212). When the energy level of the electron in the substrate 204 is higher and outside the distribution of energy levels of the traps 248, thermal relaxation may occur prior to tunneling, as indicated by the arrow 242. However, other transfer mechanisms are possible, e.g., Poole-Frenkel conduction, Fowler-Norheim tunneling or thermionic emission, among other mechanisms.

According to various embodiments, for substantial flux of electrons to reach the structural defects or traps 248 within the bulk of high-k dielectric 212 from the semiconductor substrate 204 by tunneling, the physical thickness of the high-k dielectric 212 or the combined physical thicknesses of the high-k dielectric 212 and the interlayer 208 is about 5 nm or less, about 4 nm or less or about 3 nm or less, such that the electrons 220 can traverse a portion of the high-k dielectric layer 212 (and the interlayer 208 when present) to reach structural defects 248 within the bulk of the high-k dielectric layer 212. Moreover, the tunneling probability is substantially within a time duration of measuring the SHG spectrum, e.g., less than about 30 sec., less than about 1 sec. or less than about 1 ms. In addition, when formed as part of a process flow for MOS transistor fabrication, an effective oxide thickness (EOT) of the high-k dielectric layer 212 or the combination of high-k dielectric layer 212 and the interfacial layer 208 is between about 0.5 nm and about 3 nm, between about 0.5 nm and about 2.0 nm or between about 0.5 nm and 1.0 nm.

It will be further appreciated that, for the probability of electrons to reach the structural defects or traps 248 within the bulk of high-k dielectric 212 and be captured therein to be substantial for implementation of the disclosed methods, the distribution of the defect energy of the traps 248 has a sufficient overlap with the conduction band edge (CB). In various embodiments disclosed herein, a difference between the peak or the centroid energy $E_T$ of the defect energy distribution of traps 248 is about 2 eV or less, about 1 eV or less or about 0.5 eV or less. In some other embodiments, the $E_T$ is between a conduction band of the high-k dielectric layer 212 and a conduction band of the semiconductor substrate 204

Still referring FIG. 2B, prior to significant population of the defects 248 by electrons 240, relatively little SHG occurs, and the exiting light 224 primarily comprise photons having the same energy $hv_1$ as the incident light 224.

FIG. 2C illustrates a schematic energy band diagram 200c of the semiconductor structure of the system 200a illustrated in FIG. 2A. In particular, the illustrated energy band diagram 200c corresponds to later stages of measuring the SHG spectrum, e.g., the second region of the SHG spectrum.

FIG. 2C illustrates a schematic energy band diagram 200c of the system 200a illustrated in FIG. 2A. In particular, the illustrated energy band diagram 200c corresponds to later stages compared to the energy band diagram 200b of FIG. 2B, during which the electrons trapped in the structural defects or traps 248 start to become detrapped. Without being bound to any theory, significant detrapping may begin, e.g., when a significant amount of electrons becomes trapped by the traps 248 such that an electric field builds up, thereby favoring back-tunneling of electrons 240 from the traps 248 to the conduction band of the silicon substrate 204, according to embodiments, as indicated by the arrows.

When a significant population of the traps 248 become populated by electrons 240, significant SHG occurs, and the exiting light includes the SHG light 228 having twice the energy of the incident light 220, as well as the reflected light 224 having the same energy as the incident light 220.

Regarding other system options, since an SHG signal is weak compared to the reflected beam that produces it, it may be desirable to improve the signal-to-noise ratio of SHG counts. One method of reducing noise that may be employed is to actively cool the detector. The cooling can decrease the number of false-positive photon detections that are generated randomly because of thermal noise. This can be done using cryogenic fluids such as liquid nitrogen or helium or solid state cooling through use of a Peltier device.

Determining Time Constants and Trap Density Based on SHG Spectrum

Referring back to FIG. 1, the method 100 includes, after measuring 112 a second harmonic spectrum, determining 116 from the second harmonic generation (SHG) spectrum one or both of a first time constant, which may be associated with a trapping rate of electrons by the traps 248 (FIGS. 2A-2C) and a second time constant, which may be associated with a detrapping rate of electrons from the traps 248.

Figure 3:
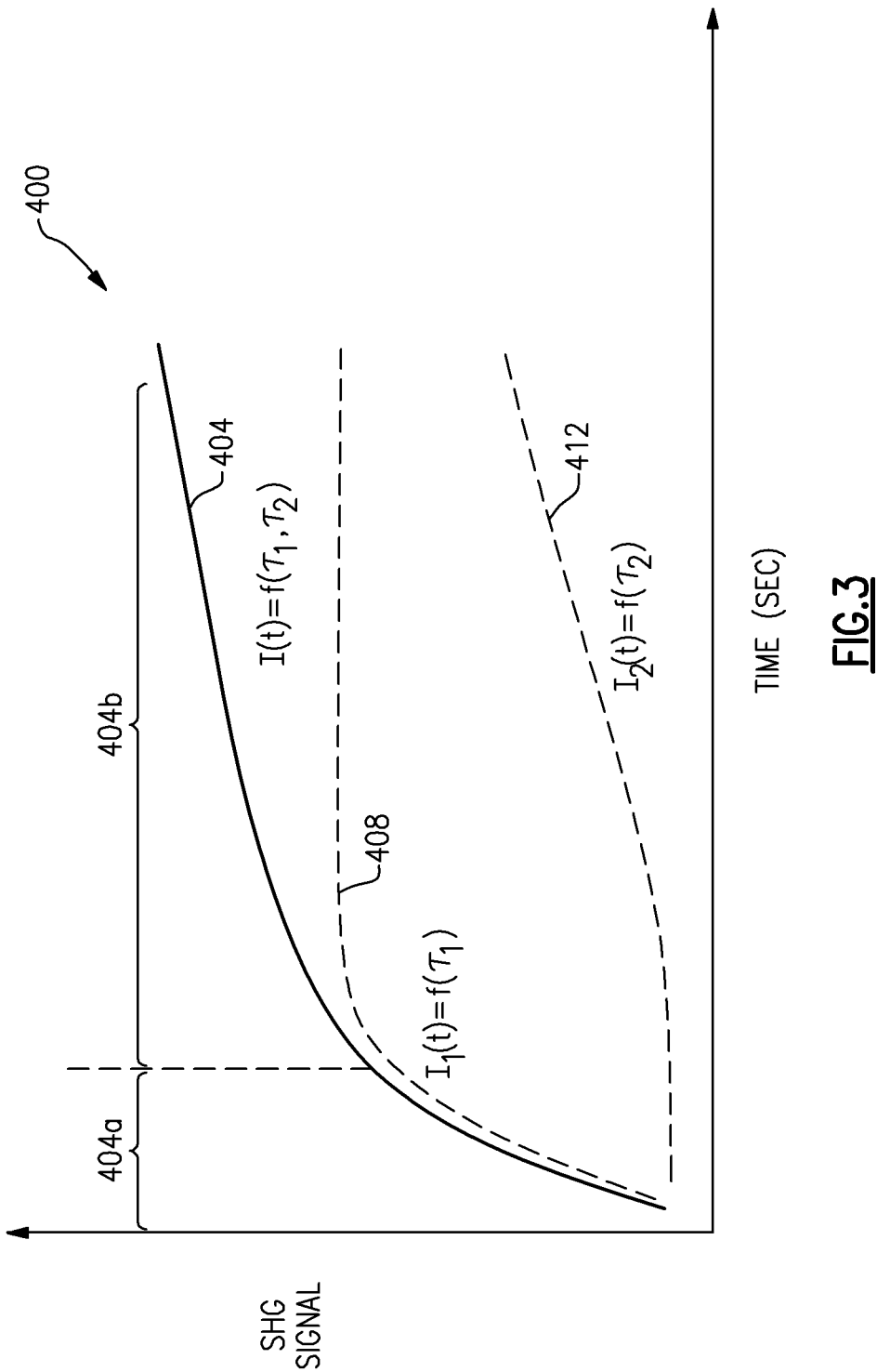
FIG. 3 illustrates a schematic second harmonic SHG spectrum for determining time constants and concentration of structural defects, according to embodiments.

FIG. 3 illustrates a schematic SHG spectrum 400 for determining time constants and concentration of traps, according to embodiments. The spectrum 404 includes a relatively fast time-varying first region 404a at relatively short times of irradiation and a relatively slow time-varying second region 404b at relatively long times of irradiation.

Without being bound to any theory, the first region 404a can correspond to the portion of the SHG spectrum 404 in which the SHG signal is dominated by increasing concentration of traps 248 having electrons trapped therein, as described above with respect to FIGS. 2A and 2B, thereby resulting in a relatively rapid increase (characterized by a first time constant $T_1$) in the SHG signal intensity. In this regime, the effect of decreasing concentration of traps 248 by detrapping, as described above with respect to FIG. 2C, is relatively small.

In contrast, the second region 404b can correspond to the portion of the SHG spectrum 404 in which the SHG signal is no longer dominated by increasing concentration of traps being filled by electrons as described above with respect to FIGS. 2A and 2B. Instead, in the this regime, the effect of decreasing concentration of structural defects having electrons trapped therein by detrapping, as described above with respect to FIGS. 2A and 2C, is relatively large, thereby resulting in a relatively slow increase (characterized by a second time constant $\tau_2$) in the SHG spectrum.

According to embodiments, the first and second regions 404a and 404b of the SHG spectrum 404 can have the SHG signals that are proportional to the density of structural defects having electrons trapped therein, and can follow logarithmic time dependences. The logarithmic time dependences can be a function of the distance of filled traps 248 from the high-k dielectric/substrate interface or when the interlayer is present, the high-k dielectric/interlayer interface. That is, the trapping and detrapping rates increases with increasing tunneling distance, as described supra with respect to FIGS. 2B and 2C, due to decreasing transport probability with increasing tunneling distance. Recognizing that the SHG signal intensity is directly proportional to the concentration of traps having electrons trapped therein, the effective time dependence of the intensity of the SHG signal from traps having electrons trapped therein, for the first and second portions 404a and 404b of the SHG spectrum 404 can be expressed as:

$$I_1(t) = I_{01}\left[1 - \exp\left(\frac{-t}{\tau_1}\right)\right] \qquad [4]$$

and $$I_2(t) = I_{02}\left[1 - \exp\left(\frac{-t}{\tau_2}\right)\right] \qquad [5]$$

In Eqs. [4] and [5], $I_1(t)$ and $I_2(t)$ correspond to SHG intensities in the first and second regions 404a and 404b of the SHG spectrum 404, respectively, and $\tau_1$ and $\tau_2$ are first and second time constants corresponding to the respective regions. The overall SHG spectrum 404 can then be expressed as a sum:

$$I(t) = I_{01}\left[1 - \exp\left(\frac{-t}{\tau_1}\right)\right] + I_{01}\left[1 - \exp\left(\frac{-t}{\tau_2}\right)\right] \qquad [6]$$

The $\tau_1$ and $\tau_2$ can be obtained by, e.g., approximating the two regions 404a and 404b as approximately being independent SHG signals 408 and 412, respectively, as illustrated in FIG. 3.

The $\tau_1$, which is dominated by trap filling, can be generally expressed as:

$$\tau_1 = \frac{1}{(n_c(x, t)\sigma_t v_{th})} \qquad [7a]$$

In Eq. [7a], $\sigma_t$ is the capture cross section, $v_{th}$ is the thermal velocity of electrons and $n_c(x,t)$ is the density of electrons transported from, e.g., tunneled from, the silicon substrate into the high-k dielectric. The values of $\sigma_t$ and $v_{th}$ can be obtained from independent theoretical or experimental determinations. As described above, $n_c(x,t)$ depends on tunneling probabilities, e.g., direct tunneling probabilities, of electrons from the substrate to the structural defects distributed within the high-k dielectric layer. Because tunneling is a quantum mechanical phenomenon, whose probability depends on the physical barrier thickness and height to be tunneled through, $n_c(x,t)$ depends on several factors, including the energy and intensity of the incident light. When the intensity and the energy of the incident light are sufficiently high such that substantially all of the traps in the high-k dielectric layer capture an electron, a substantially saturated SHG spectrum can be obtained. For example, when the energy of the incident light is sufficient for most of the electrons being transferred from the substrate to the traps have energies higher than most of the traps, and when the intensity of the incident light is sufficiently high such that the traps are rapidly filled, substantially all of the defects can have electrons captured therein before substantial detrapping occurs. Under such circumstance, a saturated SHG spectrum (not shown) can be obtained. Unlike the SHG spectrum 400 described with respect to FIG. 3, instead of having a relatively fast time-varying first region 404a at relatively short times of irradiation followed by a relatively slow time-varying second region 404b at relatively long times of irradiation, a saturated SHG spectrum can have a relatively fast time-varying first portion at relatively short times of irradiation followed by a relatively time-independent constant second portion. That is, a saturated SHG spectrum can have a shape that is qualitatively similar to the deconvoluted SHG signal curve 408 of FIG. 3. Eq. [7a] under such circumstances can be expressed as:

$$\tau_1 = \frac{1}{(N_t \sigma_t v_{th})} \quad [7b]$$

In Eq. [7b], $N_t$ is the total concentration of traps, including filled and unfilled traps in the high-k dielectric layer. Thus, according to some embodiments, the $N_t$ can be obtained from $\tau_1$ alone, based on a quantitative correlation of completely filled $N_t$ to SHG intensity.

Different types of structural defects or traps can give rise to different values of $\tau_1$ and $\tau_2$ described above. Various embodiments can be used to measure or extract each time constant having a range of values. For example, the time constants can range between 0.1 femtosecond and 1 femtosecond, 1 femtosecond and 10 femtoseconds, 10 femtoseconds and 100 femtoseconds, 100 femtoseconds and 1 picosecond, between 1 picosecond and 10 picoseconds, between 10 picoseconds and 100 picoseconds, between 100 picoseconds and 1 nanosecond, between 1 nanosecond and 10 nanoseconds, between 10 nanosecond and 100 nanoseconds, between 100 nanoseconds and 1 microsecond, between 1 nanoseconds and 100 microseconds, between 100 microseconds and 1 millisecond, between 1 microsecond and 100 milliseconds, between 100 microsecond and 1 second, between 1 second and 10 seconds, or between 10 second and 100 seconds or larger or smaller. Likewise, time delays (Δ) for example between the probe and pump (or pump and probe) can be, for example, between 0.1 femtosecond and 1 femtosecond, 1 femtosecond and 10 femtoseconds, 10 femtoseconds and 100 femtoseconds, 100 femtoseconds and 1 picosecond, between 1 picosecond and 10 picoseconds, between 10 picoseconds and 100 picoseconds, between 100 picoseconds and 1 nanosecond, between 1 nanosecond and 10 nanoseconds, between 10 nanosecond and 100 nanoseconds, between 100 nanoseconds and 1 microsecond, between 1 nanoseconds and 100 microseconds, between 100 microseconds and 1 millisecond, between 1 microsecond and 100 milliseconds, between 100 microsecond and 1 second, between 1 second and 10 seconds, between 10 second and 100 seconds. Values outside these ranges are also possible.

While the total concentration of traps $N_t$ can be obtained based on Eq. [7a], from some SHG spectra, e.g., a saturated spectrum, the methods are not so limited. Referring back to FIG. 1, the method 100 further includes, after determining $\tau_1$ and τ2 as described above, determining 120 a trap density in the high-k dielectric layer based on the one or both of the first time constant and the second time constant. According to embodiments, the trap density is determined according to the partial differential equation:

$$\frac{\partial n_t(x,t)}{\partial t} = \frac{[N_t - n_t(x,t)]}{\tau_1} - \frac{n_t(x,t)}{\tau_2} \quad [8]$$

In Eq. [8], $n_t(x,t)$ is the filled trap concentration profile in the high-k dielectric layer and $N_t$ is the total concentration of traps. Based on the $\tau_1$ and $\tau_2$ values obtained based on the second harmonic spectrum schematically illustrated in FIG. 3, one of the $n_t(x,t)$ and the $N_t$ can be determined by solving, e.g., numerically using a finite difference method, when the other of the $n_t(x,t)$ and the $N_t$ is used as inputs. For example, using $n_t(x,t)$ as an input, the differential Eq. [8] can be solved, e.g., numerically using a finite difference method, to obtain the total concentration of traps $N_t$, according to embodiments. For instance, different profiles of $n_t(x,t)$ across the thickness of the high-k dielectric can be used as input, e.g., a constant profile, a normal profile and a delta function profile (e.g., at the high-k/$SiO_2$ interface), to name a few.

On the other hand, using $N_t$ as an input, the differential Eq. [8] can be solved, e.g., numerically using a finite difference method, to obtain $n_t(x,t)$, according to embodiments. For example, as described above with respect to Ea. [7a], based on a correlation of SHG intensity to $N_t$ when saturated, the differential Eq. [8] can be solved to obtain time and spatial evolution of the filled trap concentration $n_t(x,t)$.

Data

In reference to FIGS. 5-7 below, SHG spectra are illustrated, as example implementations. The illustrated SHG spectra were measured from physical samples fabricated using atomic layer deposition. For each sample, an $HfO_2$ film was grown by atomic layer deposition (ALD) on <100> oriented Si substrate having a resistivity of about 1-5 Ohm-cm. Each of the SHG spectra illustrated in FIGS. 5-7 were obtained using an incident light having photon energy of 1.5895 eV, which corresponds to the SHG photon energy of 3.179 eV, at an average laser power of 300 mW. The incident photon was directed to a surface of the $HfO_2$ film at about 45 degrees relative to the normal direction. Each of the incident light and collected output light was P polarized. The split conditions for samples analyzed were as follows:

TABLE 1

Sample Split Chart

| Sample No. | No. of ALD cycles | H2O Vapor Pulse Duration (sec.) | HfO₂ film thickness (nm) measured by ellipsometry |
|---|---|---|---|
| 6 | 10 | 0.015 | 22.31 |
| 7 | 25 | 0.015 | 34.66 |
| 8 | 40 | 0.015 | 45.37 |
| 9 | 25 | 0.060 | 33.22 |

Figure 4:
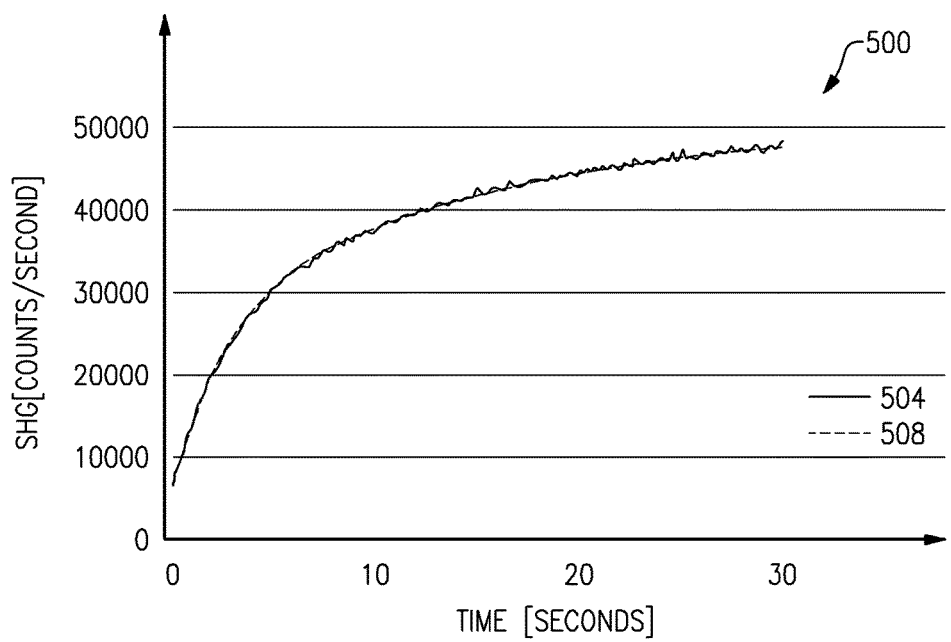
FIG. 4 illustrates an experimental second harmonic SHG spectrum used to determine time constants and concentration of structural defects in a high-k dielectric overlaid with a model spectrum generated using a method according to embodiments.

FIG. 4 shows a graph 500 of an experimental second harmonic SHG spectrum 504 and a model fit 508 obtained using the method described supra, including numerically solving Eq. [8], according to embodiments. The experimental second harmonic SHG spectrum 504 was measured from Sample No. 7 in TABLE 1 above. As discussed supra with respect to FIG. 3, each of the experimental SHG spectrum 504 and the model fit 508 shows a relatively fast time-varying first region at relatively short times (up to about 5 sec.) of irradiation, from which $\tau_1$ is obtained, followed by a relatively slow time-varying second region at relatively long times (beyond about 5 sec.) of irradiation, from which $\tau_2$ is obtained. The $\tau_1$ and $\tau_2$ values obtained were 2.6 sec. and 17 sec., respectively. The experimental SHG spectrum 504 and the model fit 508 are in excellent agreement.

Figure 5:
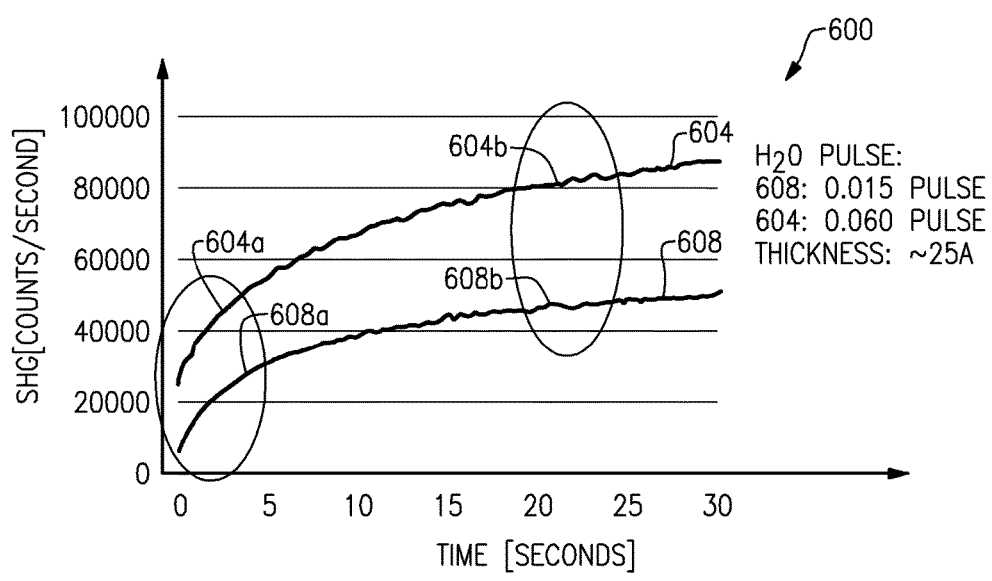
FIGS. 5 and 6 show experimental second harmonic SHG spectra of various samples used to determine time constants and concentration of structural defects in high-k dielectrics, according to embodiments.

FIG. 5 shows a graph 600 plotting experimental second harmonic SHG spectra 608 and 604 corresponding to Samples 7 and 9 having different $H_2O$ exposure times as described in TABLE 1 above. As discussed supra with respect to FIG. 3, the experimental SHG spectra 608 and 604 show relatively fast time-varying first regions 608a and 604b, respectively, at relatively short times (up to about 5 sec.) of irradiation, followed by relatively slow time-varying second regions 608b and 604b, respectively, at relatively long times (beyond about 5 sec.) of irradiation. A comparison of the SHG spectra of the two samples suggests that longer duration of $H_2O$ pulses between Hf precursors results in higher efficiency of filling of the traps.

Figure 6:
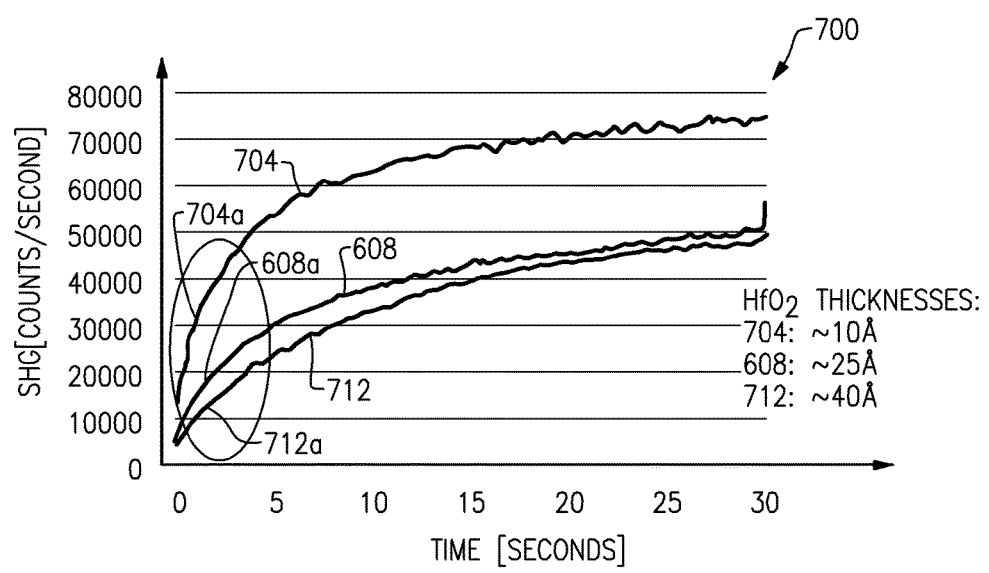

FIG. 6 shows a graph 700 of experimental second harmonic SHG spectra 712, 608 and 704 corresponding to Samples 6, 7 and 9, respectively, having different nominal thicknesses as described in TABLE 1 above. As discussed supra with respect to FIG. 3, the experimental SHG spectra 712, 608 and 704 show relatively fast time-varying first regions 712a, 608a and 704a, respectively, at relatively short times (up to about 5 sec.) of irradiation, followed by relatively slow time-varying second regions 712b, 608b and 704b, respectively, at relatively long times (beyond about 5 sec.) of irradiation. A comparison of the SHG spectra of the intensities and the time constants of the three samples shows that increasing thickness results an increasing $\tau_1$ and decreasing intensity in the fast time-varying first regions 712a, 608a and 704a.

Figure 7:
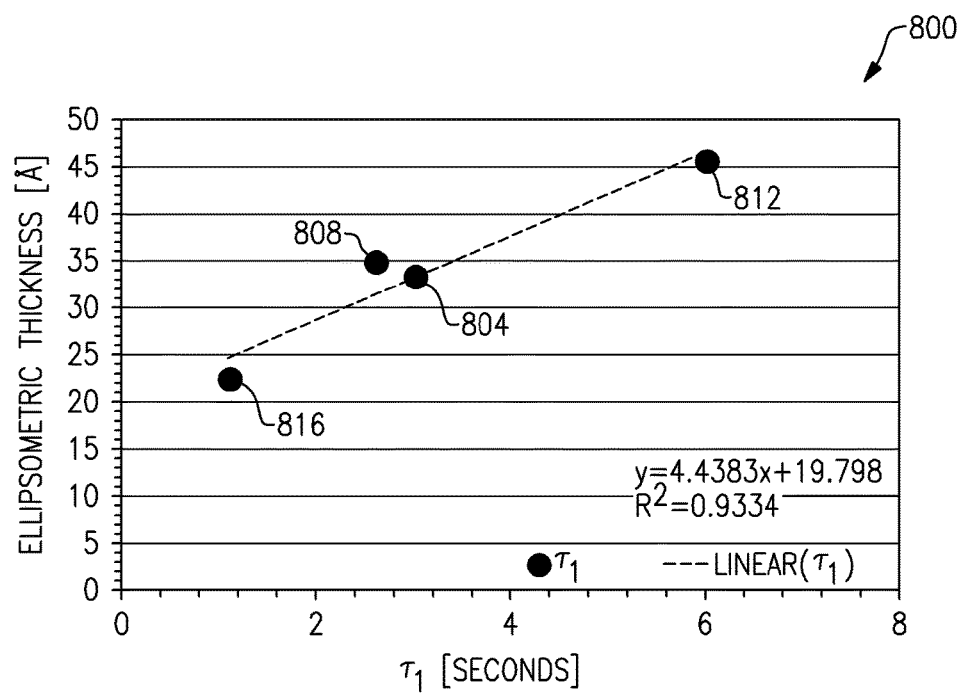
FIG. 7 is a graph correlating measured thicknesses of high-k dielectrics and time constants obtained from the high-k dielectrics based on a method according to embodiments.

FIG. 7 shows a graph 800 correlating measured thicknesses for Samples 6-9 described in TABLE 1 and $\tau_1$ values obtained according to the methods described supra. Data points 816, 808, 812 and 804 correspond to Samples 6, 7, 8 and 9, respectively. The correlation suggests that increasing the thickness of the high-k layer may lead to an increased average time for electrons to transfer from the silicon substrate into the high-k dielectric layer, thus leading to higher $\tau_1$ values. These results, combined with the results of FIG. 6, appear to suggest, without being bond to any theory, that the structural defects may not be concentrated at $HfO_2$/$SiO_2$ or $HfO_2$/Si interfaces, but instead distributed throughout the thicknesses of the $HfO_2$ films, thereby leading to lower probability of electron injection from the silicon substrate into structural defects in the $HfO_2$ films.

Variations

Exemplary invention embodiments, together with details regarding a selection of features have been set forth above. As for other details, these may be appreciated in connection with the above-referenced patents and publications as well as is generally known or appreciated by those with skill in the art. The same may hold true with respect to method-based aspects of the invention in terms of additional acts as commonly or logically employed. Regarding such methods, including methods of manufacture and use, these may be carried out in any order of the events which is logically possible, as well as any recited order of events. Furthermore, where a range of values is provided, it is understood that every intervening value, between the upper and lower limit of that range and any other stated or intervening value in the stated range is encompassed within the invention. Also, it is contemplated that any optional feature of the inventive variations described may be set forth and claimed independently, or in combination with any one or more of the features described herein.

Though the invention embodiments have been described in reference to several examples, optionally incorporating various features, they are not to be limited to that which is described or indicated as contemplated with respect to each such variation. Changes may be made to any such invention embodiment described and equivalents (whether recited herein or not included for the sake of some brevity) may be substituted without departing from the true spirit and scope hereof.

The various illustrative processes described may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, DisplayPort, or any other form.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on, transmitted over or resulting analysis/calculation data output as one or more instructions, code or other information on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. The memory storage can also be rotating magnetic hard disk drives, optical disk drives, or flash memory based storage drives or other such solid state, magnetic, or optical storage devices.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventors hereof intend that only those claims which use the words "means for" are to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

It is also noted that all features, elements, components, functions, acts and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and acts or steps from different embodiments, or that substitute features, elements, components, functions, and acts or steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

In some instances entities are described herein as being coupled to other entities. It should be understood that the terms "interfit", "coupled" or "connected" (or any of these forms) may be used interchangeably herein and are generic to the direct coupling of two entities (without any non-negligible, e.g., parasitic, intervening entities) and the indirect coupling of two entities (with one or more non-negligible intervening entities). Where entities are shown as being directly coupled together, or described as coupled together without description of any intervening entity, it should be understood that those entities can be indirectly coupled together as well unless the context clearly dictates otherwise.

Reference to a singular item includes the possibility that there is a plurality of the same items present. More specifically, as used herein and in the appended claims, the singular forms "a," "an," "said," and "the" include plural referents unless specifically stated otherwise. In other words, use of the articles allow for "at least one" of the subject item in the description above as well as the claims below.

It is further noted that the claims may be drafted to exclude any optional element (e.g., elements designated as such by description herein a "typical," that "can" or "may" be used, etc.). Accordingly, this statement is intended to serve as antecedent basis for use of such exclusive terminology as "solely," "only" and the like in connection with the recitation of claim elements, or other use of a "negative" claim limitation language. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Yet, it is contemplated that any such "comprising" term in the claims may be amended to exclusive-type "consisting" language. Also, except as specifically defined herein, all technical and scientific terms used herein are to be given as broad a commonly understood meaning to those skilled in the art as possible while maintaining claim validity.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, acts, steps, or elements of the embodiments may be recited in or added to the claims, as well as negative limitations (as referenced above, or otherwise) that define the inventive scope of the claims by features, functions, steps, or elements that are not within that scope. Thus, the breadth of the inventive variations or invention embodiments are not to be limited to the examples provided, but only by the scope of the following claim language.

What is claimed is:

1. A method of characterizing a semiconductor structure, the method comprising:
   providing a semiconductor structure comprising a semiconductor and a high-k dielectric layer formed over the semiconductor, wherein the high-k dielectric layer has electron traps formed therein;

at least partially transmitting incident light having an incident energy through the high-k dielectric layer and at least partially absorbing the incident light in the semiconductor, wherein the incident energy is sufficient to cause electrons to be transported from the semiconductor to the electron traps such that some of the electrons are temporarily trapped by the electron traps, and wherein the incident energy is sufficient for the electron traps filled with temporarily trapped electrons to cause generation of light having an energy different from the incident energy resulting from nonlinear optical effects;

obtaining a nonlinear optical spectrum resulting from the light having the energy different from the incident energy, the nonlinear optical spectrum having a first time dependent region and a second time dependent region, wherein the first time dependent region changes at a different rate in intensity compared to the second time dependent region;

determining from the nonlinear optical spectrum a first time constant from the first time dependent region or a second time constant from the second time dependent region; and determining a trap density in the high-k dielectric layer based on the the first time constant or the second time constant.

2. The method of claim 1, wherein providing the semiconductor structure comprises providing an Hf-based high-k dielectric layer on a silicon substrate.

3. The method of claim 2, wherein electron traps comprise oxygen vacancies.

4. The method of claim 3, wherein providing the semiconductor structure further comprises providing a silicon dioxide layer interposed between the silicon substrate and the Hf-based high-k dielectric layer.

5. The method of claim 4, wherein a combined physical thickness of the silicon dioxide layer and the Hf-based high-k dielectric layer is less than 4 nm such that the electrons are capable of being transported from the silicon substrate to the oxygen vacancies by tunneling from the silicon substrate to the electron traps within a time duration of measuring the nonlinear optical spectrum.

6. The method of claim 1, wherein the electron traps have a median trap energy level that is between a conduction band of the high-k dielectric layer and a conduction band of the semiconductor substrate.

7. The method of claim 1, wherein the first time constant in the first time dependent region is associated at least with a trapping rate of electrons by the electron traps, and wherein the second time constant in the second time dependent region is associated at least with a detrapping rate of electrons from the electron traps.

8. The method of claim 1, comprising determining from the nonlinear optical spectrum both the first time constant from the first time dependent region and the second time constant from the second time dependent region, and determining the trap density in the high-k dielectric layer based on both the first time constant and the second time constant.

9. The method of claim 8, wherein determining the trap density comprises numerically solving a partial differential equation relating a rate of change of filled traps with inverses of the first time constant and the second time constant.

10. The method of claim 9, wherein the partial differential equation is expressed as:

$$\frac{\partial n_t(x, t)}{\partial t} = \frac{[N_t - n_t(x, t)]}{\tau_1} - \frac{n_t(x, t)}{\tau_2},$$

wherein $n_t(x,t)$ is a filled electron trap concentration in the high-k dielectric layer, $N_t$ is a total electron trap concentration, $\tau_1$ is the first time constant and $\tau_2$ is the second time constant.

11. The method of claim 1, wherein the incident energy is sufficient for the electron traps filled with temporarily trapped electrons to cause second harmonic generation (SHG), and wherein measuring the nonlinear optical spectrum comprises measuring a second harmonic spectrum having the first time dependent region and the second time dependent region.

12. The method of claim 1, wherein the first time dependent region changes at a faster rate in intensity compared to the second time dependent region.

13. The method of claim 1, wherein the electron traps are within the bulk of the high-k dielectric layer.

14. The method of claim 1, wherein the incident light has a wavelength between 700 nm and 2000 nm.

15. The method of claim 1, wherein the first time constant is associated at least with a trapping rate of the electrons in the electron traps, and wherein the second time constant is associated at least with a detrapping rate of the electrons from the electron traps.

16. A system for characterizing a semiconductor structure, the system comprising:

a light source configured to emit incident light having an incident energy that is at least partially transmitted through a high-k dielectric layer formed on a semiconductor and at least partially absorbed by the semiconductor, wherein the high-k dielectric layer has electron traps formed therein, wherein the incident energy is sufficient to cause electrons to be transported from the semiconductor to the electron traps such that some of the electrons are temporarily trapped by the electron traps, and wherein the incident energy is sufficient for the electron traps filled with temporarily trapped electrons to cause generation of light having an energy different from the incident energy resulting from nonlinear optical effects;

a detector configured to obtain a spectrum resulting from the light having the energy different from the incident energy, the nonlinear optical spectrum having a first time dependent region and a second time dependent region, wherein the first time dependent region changes at a faster rate in intensity compared to the second time dependent region, wherein the incident energy is sufficient for the electron traps filled with temporarily trapped electrons to cause second harmonic generation (SHG), and wherein measuring the nonlinear optical spectrum comprises measuring a second harmonic spectrum having the first time dependent region and the second time dependent region; and electronics configured to determine from the second harmonic spectrum one or both of a first time constant from the first region and a second time constant from the second region, and further configured to determine a trap density in the high-k dielectric layer based on the one or both of the first time constant and the second time constant.

17. The system of claim 16, wherein the high-k dielectric layer is an Hf-based high-k layer and the semiconductor is formed of silicon.

18. The system of claim 17, wherein the electron traps comprise oxygen vacancies.

19. The system of claim 18, wherein the light source is configured to at least partially further transmit the incident light through a silicon dioxide layer interposed between the high-k dielectric layer and the semiconductor.

20. The system of claim 19, wherein a combined physical thickness of the silicon dioxide layer and the Hf-based high-k dielectric layer is less than 4 nm such that the electrons are capable of being transported from the semiconductor to the oxygen vacancies by direct tunneling from the semiconductor to the electron traps within a time duration of measuring the nonlinear optical spectrum.

21. The system of claim 20, wherein the electron traps have a median trap energy level that is between a conduction band of the high-dielectric layer and a conduction band of the semiconductor.

22. The system of claim 16, wherein the electronics are configured to determine from the second harmonic spectrum both the first time constant from the first time dependent region and the second time constant from the second time dependent region, and further configured to determine a trap density in the high-k dielectric layer based on both of the first time constant and the second time constant.

23. The system of claim 16, wherein the electron traps are within the bulk of the high-k dielectric layer.

24. The system of claim 16, wherein the light source is configured to emit incident light having a wavelength between 700 nm and 2000 nm.

25. The system of claim 16, wherein the first time constant is associated at least with a trapping rate of the electrons in the electron traps, and wherein the second time constant is associated at least with a detrapping rate of the electrons from the electron traps.

* * * * *